United States Patent
Ishikawa et al.

(10) Patent No.: US 10,135,033 B2
(45) Date of Patent: Nov. 20, 2018

(54) DIRECTIONAL LIGHT EXTRACTION FOR ORGANIC LIGHT EMITTING DIODE (OLED) ILLUMINATION DEVICES

(71) Applicant: Corning Incorporated, Corning, NY (US)

(72) Inventors: Tomohiro Ishikawa, Corning, NY (US); Michal Mlejnek, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/784,745

(22) Filed: Oct. 16, 2017

(65) Prior Publication Data

US 2018/0114949 A1  Apr. 26, 2018

Related U.S. Application Data

(60) Provisional application No. 62/410,500, filed on Oct. 20, 2016.

(51) Int. Cl.
*H01L 33/58* (2010.01)
*H01L 51/52* (2006.01)

(52) U.S. Cl.
CPC .......... *H01L 51/5275* (2013.01); *H01L 33/58* (2013.01); *H01L 51/5268* (2013.01); *H01L 2251/5338* (2013.01)

(58) Field of Classification Search
CPC ...... H01L 27/32; H01L 33/58; H01L 51/5268
USPC ....................................................... 257/98
See application file for complete search history.

(56) References Cited

U.S. PATENT DOCUMENTS

| | | | |
|---|---|---|---|
| 5,396,350 A | 3/1995 | Beeson et al. | |
| 5,428,468 A | 6/1995 | Zimmerman et al. | |
| 5,995,690 A | 11/1999 | Kotz et al. | |
| 6,129,439 A | 10/2000 | Hou et al. | |
| 6,771,021 B2 | 8/2004 | Cok | |
| 8,427,747 B2 | 4/2013 | Le et al. | |
| 8,619,363 B1 * | 12/2013 | Coleman | G02B 5/18 359/576 |
| 2004/0217702 A1 | 11/2004 | Garner et al. | |

(Continued)

OTHER PUBLICATIONS

Ide et al; "A Novel Dot-Pattern Generation to Improve Luminance Uniformity of LCD Backlight"; Journal of the Society for Information Display 11(4), 659 (2003).

(Continued)

*Primary Examiner* — George Fourson, III

(57) ABSTRACT

An organic light emitting diode (OLED) incorporating a light extraction film is disclosed. The light extraction film may be used for enhancing light extraction from a light source. The light extraction film may include an array of 3-D microprisms, an interstitial region, and a glass layer. Each microprism may have an area of a first surface (A1) and an area of a second surface (A2). The A2 may be equal to or less than A1. Each microprism may have a pair of oppositely disposed sidewalls. The interstitial region may be disposed between the pair of oppositely disposed sidewalls of adjacent microprisms. The interstitial region may have an index of refraction less than an index of refraction of the microprism. The glass layer may be attached to the first surface of the array of 3-D microprisms. The glass layer may be less than about 1 mm thick.

25 Claims, 3 Drawing Sheets

(56) References Cited

U.S. PATENT DOCUMENTS

| | | | |
|---|---|---|---|
| 2006/0043362 A1* | 3/2006 | Ishikawa | H01L 51/5275 257/40 |
| 2007/0058127 A1* | 3/2007 | Mather | G02B 27/2214 349/159 |
| 2012/0080710 A1* | 4/2012 | Inoue | G02B 5/045 257/98 |
| 2012/0098421 A1 | 4/2012 | Thompson | |
| 2013/0051032 A1 | 2/2013 | Jones et al. | |
| 2013/0317784 A1 | 11/2013 | Huang et al. | |
| 2014/0197390 A1* | 7/2014 | Stromer | H01L 51/56 257/40 |
| 2016/0223154 A1* | 8/2016 | Nango | E06B 5/00 |
| 2016/0320532 A1* | 11/2016 | Purchase | G02B 5/0231 |

OTHER PUBLICATIONS

Kalantar et al; "Backlight Unit With Double-Surface Light Emission Using a Single Micro-Structured Lightguide Plate"; Journal of the Society for Information Display 12(4), 379 (2004).

Suzuki; "Two Approaches to the Luminance Enhancement of Backlighting Units for LCDs"; Journal of the Society for Information Display 7(3), 157 (1999).

\* cited by examiner

DIRECTIONAL LIGHT EXTRACTION FOR ORGANIC LIGHT EMITTING DIODE (OLED) ILLUMINATION DEVICES

This application claims the benefit of priority under 35 U.S.C. § 119 of U.S. Provisional Application Ser. No. 62/410,500, filed on Oct. 20, 2016, the content of which is relied upon and incorporated herein by reference in its entirety.

FIELD OF INVENTION

The disclosure relates generally to organic light emitting diodes (OLEDs) and display devices that include OLEDs, more specifically, to a directional light extraction for OLED illumination devices.

BACKGROUND

Organic light emitting diodes (OLEDs) are light emitting diodes (LEDs) incorporating an organic material as the light emitting material. OLEDs are an active area of research for solid state lighting and have many potential advantages over current inorganic material-based LEDs. There are many different designs for OLEDs, but one limitation they all suffer from is that it can be challenging to extract significant amounts of light from the device. Because the emission layers are typically made from high refractive index materials, a high proportion of light is trapped within the device, thus lowering the overall efficiency. The typical way to improve light extraction from the substrate is to place a diffusive structure in the front to extract the trapped (TIR, total internal reflection) light. However, this method only gives moderate improvements. There continues to be a need to improve the amount of light efficiently extracted from OLED devices.

SUMMARY

An organic light emitting diode (OLED) may comprise a transparent substrate, a transparent electrode, an organic light emitting material stack, a reflective electrode, and an extraction film. The transparent substrate may be made of glass. The transparent electrode may be attached to the transparent substrate. The organic light emitting material stack having organic light emitting diode layers may be disposed on the transparent electrode opposite to the transparent substrate. The reflective electrode may be disposed on the organic light emitting material stack. The reflective electrode may be opposite to the transparent substrate. The extraction film may be attached onto the transparent substrate. The extraction film may have an array of 3-D microprisms. Each microprism may have an area of a first surface (A1) and an area of a second surface (A2). The second surface may be proximal to the transparent substrate and the first surface may be distal to the transparent substrate. A2 may be equal or less than A1. The extraction film may further comprise a thin glass layer disposed on the array of 3-D microprisms opposite to the transparent substrate. The thin glass layer may be less than about 1 mm thick.

In another embodiment, a light extraction film may be used for enhancing light extraction from a light source. The light extraction film may include an array of 3-D microprisms, an interstitial region, and a glass layer. Each microprism may have an area of a first surface (A1) and an area of a second surface (A2). The A2 may be equal to or less than A1. Each microprism may have a pair of oppositely disposed sidewalls. The interstitial region may be disposed between the pair of oppositely disposed sidewalls of adjacent microprisms. The interstitial region may have an index of refraction less than an index of refraction of the microprism. The glass layer may be attached to the first surface of the array of 3-D microprisms. The glass layer may be less than about 1 mm thick.

Additional features and advantages of the present disclosure will be set forth in the detailed description, which follows, and in part will be readily apparent to those skilled in the art from that description or recognized by practicing the embodiments described herein, including the detailed description, the claims, and the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF SEVERAL VIEWS OF THE DRAWINGS

The following is a description of the figures in the accompanying drawings. The figures are not necessarily to scale, and certain features and certain views of the figures may be shown exaggerated in scale or in schematic in the interest of clarity or conciseness.

Figure 1:
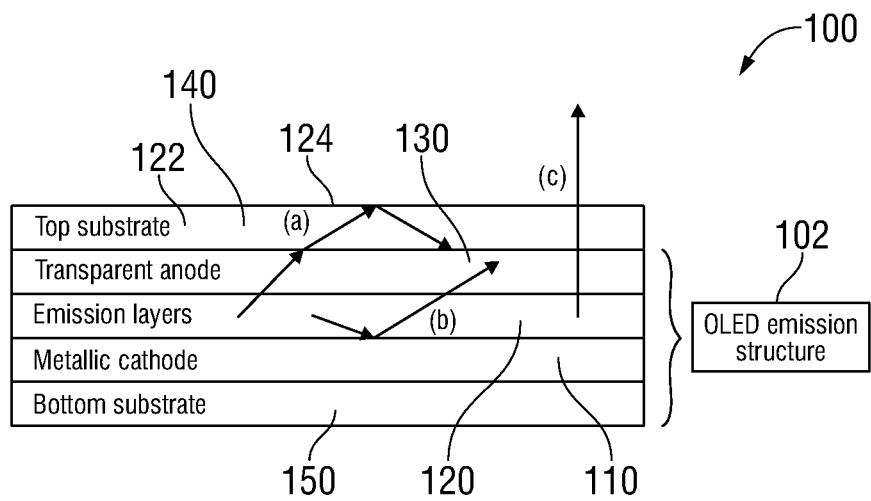
FIG. 1 is a prior art reference OLED design.

The foregoing summary, as well as the following detailed description of certain inventive techniques, will be better understood when read in conjunction with the figures. It should be understood that the claims are not limited to the arrangements and instrumentality shown in the figures. Furthermore, the appearance shown in the figures is one of many ornamental appearances that can be employed to achieve the stated functions of the apparatus.

DETAILED DESCRIPTION

The present disclosure can be understood more readily by reference to the following detailed description, drawings, examples, and claims, and their previous and following description. However, before the present compositions, articles, devices, and methods are disclosed and described, it is to be understood that this disclosure is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the disclosure is provided as an enabling teaching of the disclosure in its currently known embodiments. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Disclosed are materials, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed, specific reference of each various individual and collective combinations may not be explicitly disclosed, yet each is specifically contemplated and described herein.

Reference will now be made in detail to the present preferred embodiment(s), examples of which are illustrated in the accompanying drawings. The use of a particular reference character in the respective views indicates the same or like parts.

Unless otherwise indicated, all numbers expressing quantities of ingredients, properties such as size, weight, reaction conditions and so forth used in the specification and claims are to the understood as being modified in all instances by the term "about". Accordingly, unless indicated to the contrary, the numerical parameters set forth in the following specification and attached claims are approximations that may vary depending upon the desired properties sought to be obtained by the invention. At the very least, and not as an attempt to limit the application of the doctrine of equivalents to the scope of the claims, each numerical parameter should at least be construed in light of the number of reported significant digits and by applying ordinary rounding techniques.

As used herein, the term "about" means plus or minus 10% of the numerical value of the number with which it is being used. Therefore, about 50% means in the range of 45%-55%.

Broadly, the present disclosure relates to OLEDs, and more specifically, to a directional light extraction film for OLED illumination devices. The directional light extraction film may include a glass substrate with microstructures, such as an array of prisms. Light generated from the light emission layer can be extracted from the array of prisms and can be released outside of the OLED.

OLED devices offer an advantage over traditional inorganic LEDs, where advantages include color quality, diffuse light generation, and the potential for mechanical flexibility. However, the present OLED devices are not suitable replacements for inorganic LEDs in several applications, typically because of the two limitations that originate from (1) lower electrical efficiency at the same light brightness level, and (2) encapsulation-related lifetime degradation.

These two present OLED device limitations provide potential market entry opportunities for companies. For the encapsulation-related lifetime degradation limitation, willow-glass based encapsulation has been developed as a means to provide value by combining an increased lifetime while enabling mechanical flexibility.

This disclosure provides a solution to the problem of low OLED electrical efficiency by adding a light extraction film for enhancing light extraction from a light source, such as a light emitting layer. Extracting light from OLED devices is essential for operation efficiency. As much as about 80% of the generated light can be trapped within the organic layers and glass substrates to be subsequently absorbed by the metallic cathode.

As shown in FIG. 1, the reference OLED design has a problem of low OLED electrical efficiency because a majority of the light cannot escape the OLED due to total internal reflection (TIR) interfaces. The two important TIR interfaces that reduce light extraction are shown in FIG. 1 to be (1) the transparent conductor/glass interface and (2) the glass/air interface. As the emission layers are typically made from the high refraction index, high proportion of light is trapped within the substrate, thus lowering the overall efficiency.

Still in FIG. 1, an OLED device 100 comprises an OLED emission structure 102 and a top substrate 140. The OLED emission structure 102 may include a reflective metallic cathode 110, OLED light emission layers 120, a transparent anode 130, and a bottom substrate 150. As shown in FIG. 1, the OLED device 100 may have a problem of low OLED electrical efficiency because a majority of the light, such as ray (a) cannot escape the OLED due to total internal reflection (TIR) interfaces. Light, such as ray (b), emitted backward, may be reflected to the forward direction by the metallic cathode 110. The two important TIR interfaces that reduce light extraction are shown in FIG. 1 to be (1) the transparent conductor/glass interface 122 and (2) the glass/air interface 124. As the emission layers are typically made from the high refraction index, high proportion of light is trapped within the substrate, thus lowering the overall efficiency.

Figure 2:
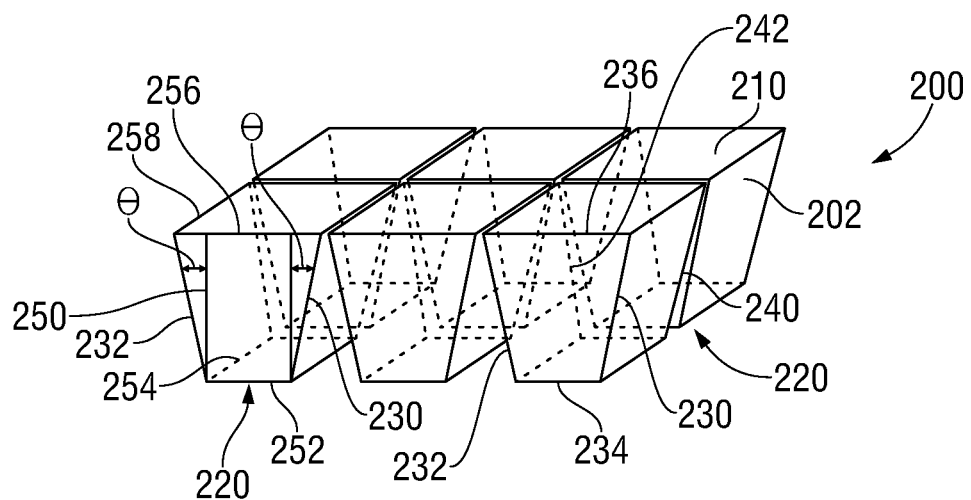
FIG. 2 is a schematic perspective view of a 3-D arrangement of an array of prisms according to one embodiment.

In order to extract light from the OLED device 100, an array of prisms may be put above the top substrate 140. As shown in FIG. 2, the array of 3-D microprisms 200 may include a plurality of microprisms 202. Each microprism 202 may further include a first surface 210 and a second surface 220. The area of the first surface 210 may be defined as A1. The area of the second surface 220 may be defined as A2. The area of A2 may be equal to or less than the area of A1. Each microprism 202 may have a pair of oppositely disposed sidewalls 230, 232, 240 and 242. The second surface 220 may be known as a light input surface 220 at the bottom of the microprism 202 adjacent to or proximal to the top substrate 140. The first surface 210 may be also known as output surface 210 at the first surface of the microprism 202 distal from the light input surface 220. The pair of oppositely disposed sidewalls 230, 232, 240 and 242 may be disposed between and contiguous with the light input surface 220 and the light output surface 210.

The microprisms 202 may be arranged in any pattern above the top substrate 140 (shown in FIG. 1), such as a square, rectangular or hexagonal pattern. The microprisms 202 may be aligned to each other. In another embodiment, the microprisms 202 may have a distance to each other. The distance to each other may be equal or may vary widely depending on the dimension of the top substrate 140. In addition, the distance to each other may vary across the surface of the top substrate 140.

The microprisms 202 may be constructed to form a six-sided geometrical shape having the light input surface 220 preferably parallel with the light output surface 210. Each microprism 202 may be formed so that sidewall 230 or 232 may form a tilt angle θ to the normal of the light input surface 220. The desired values of tilt angle θ may range from about 0 degree to about 25 degrees. More preferred values for tilt angle θ range from about 2 degrees to about 20 degrees. Preferably, the tilt angles θ associated with sidewalls 230 and 232 are equal, but equal angles are not necessary.

The microprisms 202 can be constructed from any transparent solid material. Preferred materials may have an index of refraction equal to or greater than the top substrate 140. Preferred materials may have a refractive index between about 1.40 and about 1.65. One method of manufacturing microprisms 202 includes injection molding. Materials useful in this method include polycarbonate, acrylic and poly (4-methyl pentene). Alternative methods of manufacture may include polymers formed by photopolymerization of acrylate monomer mixtures composed of urethane acrylates and methacrylates, ester acrylates and methacrylates, epoxy acrylates and methacrylates, (poly) ethylene glycol acrylates and methacrylates and vinyl containing organic monomers. Useful monomers include methyl methacrylate, n-butyl acrylate, 2-ethylhexyl acrylate, isodecyl acrylate, 2-hydroxyethyl acrylate, 2-hydroxypropyl acrylate, cyclohexyl acrylate, 1,4-butanediol diacrylate, ethoxylated bisphenol A diacrylate, neopentylglycol diacrylate, diethyleneglycol diacrylate, diethylene glycol dimethacrylate, 1,6-hexanediol diacrylate, trimethylolpropane triacrylate, pentaerythritol triacrylate and pentaerythritol tetra-acrylate. Especially useful are mixtures wherein at least one monomer is a multifunctional monomer such as diacrylate or triacrylate, as these will produce a network of crosslinks within the reacted photopolymer. The most preferred materials for microprisms 202 formed by photolithography are crosslinked polymers formed by photopolymerizing mixtures of ethoxylated bisphenol A diacrylate and trimethylolpropane triacrylate.

Referring to FIG. 2, microprism 202 has height 250. Height 250 may vary widely depending on the dimensions of the top substrate 140. That is, smaller top substrate, such as a small light OLED bulb would have greatly reduced dimensions versus a larger OLED bulb.

Microprism 202 may have lengths 252 and 256. Length 252 corresponds to the light input surface 220 and length 256 corresponds to the light output surface 210. Length 256 can be equal to or greater than length 252. Lengths 252 and 256 may vary widely depending on the dimensions of the top substrate 140. In addition, the length 252 may vary across the surface of the top substrate in order to compensate for a lowering of the light intensity inside top substrate 140 as the distance from light emission layers 120 increases. That is, microprisms 202 that are closer to light emission layers 120 may have a smaller length 252 as compared to microprisms farther from light emission layers 120. This lowering of the light intensity is due to light removal by the other microprisms of the array.

Microprism 202 has widths 254 and 258 where width 254 corresponds to the light input surface 220 and width 258 corresponds to the light output surface 210. Widths 254 and 258 may vary widely depending on the dimensions of the top substrate 140 and are a function of tilt angle θ and height 250. In addition, the width 254 may vary across the surface of the top substrate 140 in order to compensate for a lowering of the light intensity inside the top substrate 140 as the distance from light emission layers 120 increases. It may be desirable that length 252 be larger than width 254. It may be preferred that the ratio of length 252 to width 254 be in the range of 1.2:1 to 5:1. It may be more preferred that the ratio be in the range of 1.5:1 to 3:1.

Figure 3:
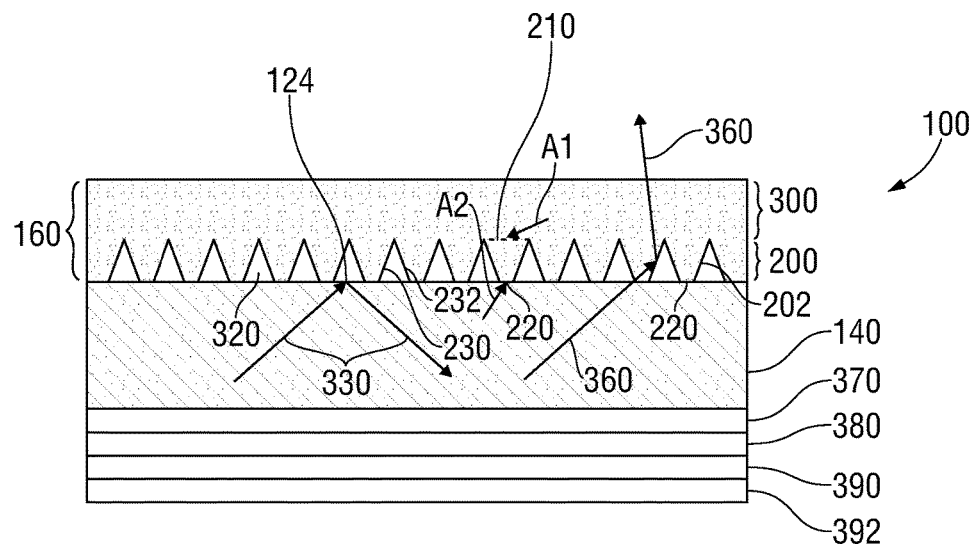
FIG. 3 is a cross-sectional view of an extraction film in use.

As shown in FIG. 3, an organic light emitting diode (OLED) may comprise a transparent electrode 370, an organic light emission material stack 380, a transparent substrate 140, a reflective electrode 390, a bottom substrate 392, and an extraction film 160. The transparent substrate 140 may be made of glass. The transparent electrode 370 may be attached to the transparent substrate. The organic light emitting material stack 380 may have organic emitting diode layers. The organic light emitting material stack 380, which is not pixelated, may be disposed on the transparent electrode 370 opposite to the transparent substrate 140. The reflective electrode 390 may be disposed on the organic light emitting material stack 380 and may be opposite to the transparent substrate 140. The light extraction film 160 for enhancing light extraction from a light source, such as the organic light emitting material stack 380, may include an array of 3-D microprisms 200 and a glass layer 300. The glass layer 300 may be attached to the first surface 210 of the microprisms 202. The glass layer 300 may be less than 1 mm thick, for example.

Each microprism 202 may have a light input surface or the second surface 220 at the bottom optically coupled to a surface of the transparent substrate 140. Each microprism 202 may have a light output surface or first surface 210 at the top of the microprism 202. An area of a first surface 210 may be defined as A1. An area of a second surface may be defined as A2. A2 may be equal to or less than A1. Each microprism 202 may have a pair of oppositely disposed sidewalls 230 and 232 disposed between and contiguous with the light input surface 220. At least one of the sidewalls 230, 232 may form a first tilt angle θ with respect to the normal of the light input surface 220 as shown in FIG. 2. The first tilt angle θ may be at least about 15 degrees and at most about 50 degrees to the normal of the light input surface.

The microprisms 202 may be separated by interstitial regions 320. The index of refraction of interstitial region 320 may be less than the index of refraction of the microprisms 202. Preferred materials for interstitial regions may include air, with an index of refraction of 1.00 and fluoropolymer materials with an index of refraction ranging from about 1.16 to about 1.40. The most preferred material is air.

In operation, light ray 330 travels through the interface 124 between the top glass 140 and the interstitial regions 320, such as air. Due to total internal reflection (TIR), the light ray 330 bounces back to the top substrate 140. However, the light ray 360 enters the microprism 202 by way of light input surface 220, reflects off or is redirected by at least one of sidewalls 232, 230, and exits or emerges the microprism 202 through the light output surface 210 and glass layer 300.

Figure 4:
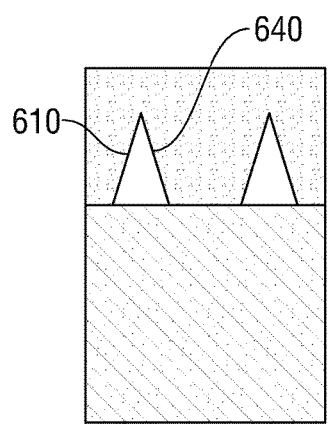
FIG. 4 is a cross-sectional view of a microstructure with inverted prisms having a flat top.

As shown in FIG. 4, the microprisms 202 may further comprise four sidewalls wherein each sidewall comprises a planar face 610 or 640. The four sidewalls are angled in such a way with respect to the normal of the surface of the light emission layers 120 that light traveling through the top substrate 140 is captured and redirected by the microprisms 202, reflects through the microprisms 202 via TIR and emerges from the microprisms 202 as a spatially directed light source. A spatially directed light source is meant to include a substantially collimated light source in a direction substantially perpendicular to the light output surface 210 or a light source directed at a controlled angle with respect to the normal of the light output surface 210.

Figure 5:
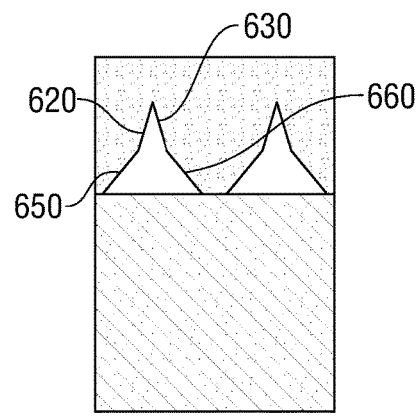
FIG. 5 is a cross-sectional view of a microstructure with multiple discontinuous slopes.
Figure 6:
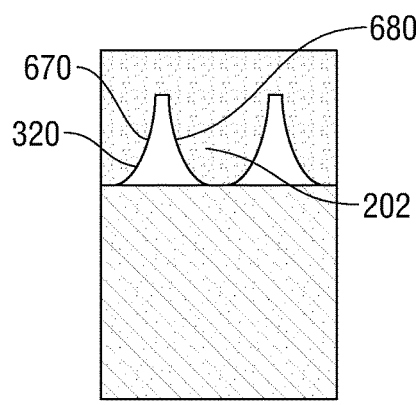
FIG. 6 is a cross-sectional view of a microstructure with parabolic curvatures.

Alternatively, as shown in FIG. 5, at least one of the sidewalls comprises two or more planar reflective faces 620 and 650 or 630 and 660 to improve the reflectivity of the microprism 202. The number of planar faces forming the sidewall may become infinitesimally minute such that all or part of the sidewall is arcuately shaped. In one embodiment, the sidewall is parabolically shaped sidewall 670 or 680 as shown in FIG. 6. The microprism 202 may become a compound parabolic concentrator (CPC) when the sidewall is parabolically shaped. The compound parabolic concentrator may receive light emitted from the light emitting layers and collimate it, and the tapered microprisms 202 may direct the collimated light from the compound parabolic concentrator 202 towards outside OLED. In another related embodiment, the compound parabolic concentrator 202 and the glass layer 300 may be transparent, and light may be emitted through a light output surface 210 of both the compound parabolic concentrator and the glass layer.

Figure 7:
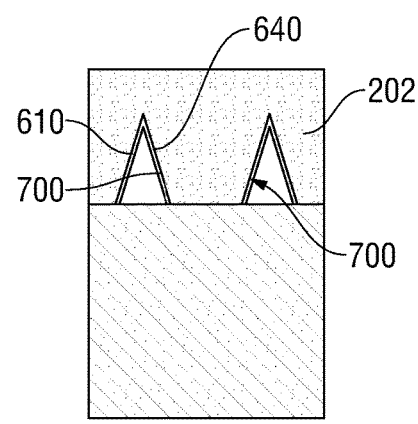
FIG. 7 is a cross-sectional view a microstructure coated with highly reflective material.

As shown in FIG. 7, the planar faces 610 and 640 may further include a reflector coating 700. The reflector coating 700 may be made of a highly reflective material, such as a metal, for example. This embodiment may rely on recycling of the portion of the light that enters the low index (air) void and is reflected back. The light reflected back to the OLED structure may have a chance to be scattered back in the direction of the microprism 202 and into the transparent openings between the coated structures.

Figure 8:
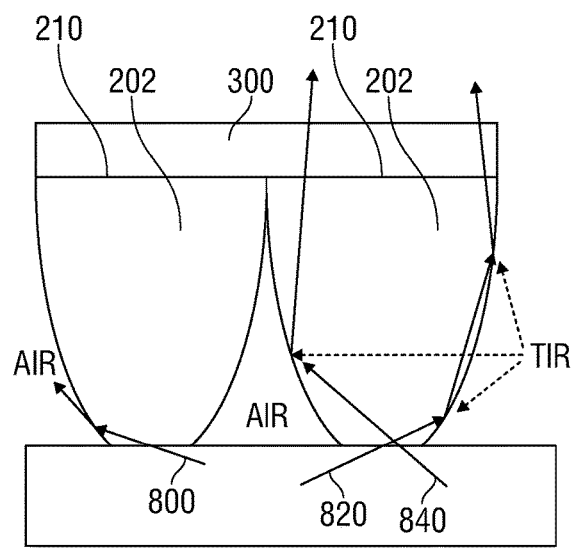
FIG. 8 is a schematic showing of total internal reflection (TIR) based redirection of light by a proposed microstructure.

FIG. 8 illustrates an extraction principle that is based on a proper geometry of the microstructure that ensures TIR reflection of the light impinging on it. The microprisms 202 have parabolically shaped sidewalls. Similarity of the optical properties of the top substrate and the glass support of the microstructure leads to a similar angular light distribution in the glass support layer. Without the microstructure, only the light emitted by the OLED, having an angle of incidence on the interface between the substrate and glass smaller than the critical TIR angle, will be transmitted through. The rest may suffer TIR. Various effects of the microstructure on the light incident on it from the OLED unit are shown in FIG. 8. Light incident on the border with an angle less than the critical angle would be partially transmitted, such as light ray 800, while light incident on the border at larger angles with respect to normal would be totally internally reflected, such as light rays 820 and 840. Some of the light at the interface at large angles is deflected by the microstructure towards the emission angle normal to the OLED/microstructure device, while part of the light normal to the interface will be deflected by the structure to larger angles. The microstructure can be optimized to minimize the unwanted scattering of light into large angles, maximizing the forward bias in the extracted light.

Arrays of microprisms 202 can be manufactured by any number of techniques such as molding, including injection and compression molding, casting, including hot roller pressing casting, photopolymerization within a mold and photopolymerization processes which do not employ a mold. A preferred manufacturing technique may be one that allows the extraction film 160, which comprises an array of microprisms 200, and an OLED to be manufactured as a single integrated unit. An advantage of this technique would be the elimination of alignment errors between the array of microprisms and OLED if the arrays were manufactured separately and then attached in the relationship described above.

A flexible OLED or light extraction film with forward emission bias can be shaped so that it can provide specific light directional properties. For example, rolling a sheet into a tubular shape would accomplish a cylindrical lighting source. The achieved light directionality may be beneficial for light angular distribution manipulation using other optical components like mirrors, parabolic mirrors, spherical mirrors, and lenses or system of lenses.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. For example, FIG. 3 is merely a schematic illustration of the layered structure of an OLED 100 according to one embodiment of the present disclosure. A variety of OLED configurations is contemplated herein, the structural details of which may be conveniently gleaned from the present description, the accompanying drawings, and the appended claims. FIG. 3 is presented for illustrative purposes and is not intended to create a presumption that each of the various aspects illustrated therein are a necessary part of the various embodiments contemplated herein.

The claims appended hereto should be taken as the sole representation of the breadth of the present disclosure and the corresponding scope of the various embodiments described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present disclosure, it is noted that this term is introduced in the claims as an open-ended transitional phrase that is used to introduce a recitation of a series of characteristics of the structure and should be interpreted in like manner as the more commonly used open-ended preamble term "comprising."

It is also noted that recitations herein of "at least one" component, element, etc., should not be used to create an inference that the alternative use of the articles "a" or "an" should be limited to a single component, element, etc.

It is further noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

While the invention has been described with respect to a limited number of embodiments, those skilled in the art, having benefit of this disclosure, will appreciate that other embodiments can be devised that do not depart from the scope of the invention as disclosed herein. Accordingly, the scope of the invention should be limited only by the attached claims.

What is claimed is:
1. An organic light emitting diode (OLED), comprising:
a transparent substrate, wherein the transparent substrate is made of glass;
a transparent electrode attached to the transparent substrate;

an organic light emitting material stack having organic light emitting diode layers, wherein the organic light emitting material stack is disposed on the transparent electrode opposite to the transparent substrate;

a reflective electrode on the organic light emitting material stack, wherein the reflective electrode is opposite to the transparent electrode; and an extraction film attached onto the transparent electrode, wherein the extraction film has an array of 3-D microprisms, each microprism having an area of a first surface (A1) and an area of a second surface (A2), wherein the second surface is proximal to the transparent substrate and the first surface is distal to the transparent substrate, wherein A2 is equal to or less than A1, wherein the extraction film further comprises a glass layer disposed on the array of 3-D microprisms opposite to the transparent substrate, wherein the thin glass layer is less than about 1 mm thick.

2. The organic light emitting diode of claim 1, wherein each microprism has a light input surface at the second surface of the microprism, and the first light input surface is optically coupled to a surface of the transparent substrate.

3. The organic light emitting diode of claim 2, wherein each microprism has a light output surface at the first surface of the microprism distal from the light input surface.

4. The organic light emitting diode of claim 3, wherein each microprism has a pair of oppositely disposed sidewalls contiguous with the light input surface.

5. The organic light emitting diode of claim 4, wherein at least one of the sidewalls forms a first tilt angle with respect to the normal of the light input surface.

6. The organic light emitting diode of claim 4, wherein at least one of the sidewalls has one face.

7. The organic light emitting diode of claim 4, wherein each microprism further comprises a second pair of oppositely disposed sidewalls disposed between and contiguous with the light input surface and the light output surface, wherein each microprism is configured to receive light through the light input surface emitted from transparent substrate and to redirect the light by at least one sidewall so that the light emerges through the light output surface.

8. The organic light emitting diode of claim 4, wherein the organic light emitting material stack is not pixelated.

9. The organic light emitting diode of claim 4, wherein at least one of the sidewalls is arcuately shaped, wherein the sidewall is parabolically shaped.

10. The organic light emitting diode of claim 5, wherein the first tilt angle is at least about 15 degrees and at most about 50 degrees to the normal of the light input surface.

11. The organic light emitting diode of claim 4 further comprising an interstitial region between the sidewalls of adjacent microprisms and having an index of refraction less than an index of refraction of the microprism.

12. The organic light emitting diode of claim 11, wherein the interstitial region has reflector coatings attached to sidewalls of adjacent microprisms defining the interstitial region.

13. The organic light emitting diode of claim 12, wherein the organic light emitting diode is flexible.

14. A light extraction film for enhancing light extraction from a light source, comprising:

an array of 3-D microprisms, each microprism having an area of a first surface (A1) and an area of a second surface (A2), wherein the area of A2 is equal to or less than the area of A1, each microprism has a pair of oppositely disposed sidewalls;

an interstitial region between the sidewalls of adjacent microprisms, wherein the interstitial region has an index of refraction less than an index of refraction of the microprism; and a glass layer attached to the first surface of microprisms, wherein the glass layer is less than about 1 mm thick, wherein first surface of each microprism is proximal to the glass layer and second surface is distal to the glass layer.

15. The light extraction film of claim 14, wherein each microprism has a light input surface at the second surface of the microprism.

16. The light extraction film of claim 15, wherein each microprism has a light output surface at the first surface of the microprism distal from the light input surface.

17. The light extraction film of claim 16, wherein the pair of oppositely disposed sidewalls is contiguous with the light input surface.

18. The light extraction film of claim 14, wherein at least one of the sidewalls forms a first tilt angle with respect to the normal of the light input surface.

19. The light extraction film of claim 14, wherein at least one of the sidewalls has one face.

20. The light extraction film of claim 14, wherein each microprism further comprises a second pair of oppositely disposed sidewalls disposed between and contiguous with the light input surface and the light output surface, wherein each microprism is configured to receive light through the light input surface emitted from transparent substrate and to redirect the light by at least one sidewall so that the light emerges through the light output surface.

21. The light extraction film of claim 14, wherein the organic light emitting material stack is not pixelated.

22. The light extraction film of claim 14, wherein at least one of the sidewalls is arcuately shaped, wherein the sidewall is parabolically shaped sidewall.

23. The light extraction film of claim 18, wherein the first tilt angle is at least about 15 degrees and at most about 50 degrees to the normal of the light input surface.

24. The light extraction film of claim 19, wherein the face further comprises a reflector coating.

25. The light extraction film of claim 24, wherein the light extraction film is flexible.

* * * * *